United States Patent

Zaim

[11] Patent Number: 5,973,941
[45] Date of Patent: Oct. 26, 1999

[54] ELECTRICITY METER WITH A SWITCHING MODE TRANSFORMER POWER SUPPLY CIRCUIT

[75] Inventor: Brahim Zaim, Sères Anxaumont, France

[73] Assignee: Schlumberger Industries, S.A., Montrouge, France

[21] Appl. No.: 09/103,783

[22] Filed: Jun. 24, 1998

[51] Int. Cl.⁶ .................................................. H02M 3/335

[52] U.S. Cl. .............................................. 363/21; 363/131

[58] Field of Search ................................. 363/20, 21, 95, 363/98, 56, 131, 132

[56] References Cited

U.S. PATENT DOCUMENTS

| | | | |
|---|---|---|---|
| 5,291,386 | 3/1994 | Wu | 363/21 |
| 5,414,610 | 5/1995 | Brainard | 363/21 |
| 5,825,638 | 10/1998 | Shutts | 363/21 |
| 5,841,641 | 11/1998 | Faullk | 363/21 |

*Primary Examiner*—Adolf Deneke Berhane
*Attorney, Agent, or Firm*—Leonard W. Pojunas

[57] ABSTRACT

An electronic electricity meter comprising a measuring circuit and a power supply circuit. The power supply circuit comprises a main capacitor and a transformer controlled by a switching mode circuit. The transformer has an additional winding between the core and the primary and an integrator circuit rated to supply at its output a voltage image substantially proportional to the main capacitor voltage.

9 Claims, 3 Drawing Sheets

ELECTRICITY METER WITH A SWITCHING MODE TRANSFORMER POWER SUPPLY CIRCUIT

The present invention concerns an electronic electricity meter comprising a measuring circuit for measuring the consumption of electricity and a power supply circuit comprising a main capacitor supplied with power by a mains electrical power supply and a switching mode transformer having at least one primary wound around the core of the transformer and at least one secondary wound around the primary, the primary being connected to the main capacitor via a switching circuit and the secondary being connected to the measuring circuit.

BACKGROUND OF THE INVENTION

The use of a transformer controlled by a switching mode circuit ("switching mode transformer") in a power supply circuit as a "DC/DC" converter is well known in the field of electronic electricity meters. The main capacitor is connected and disconnected alternately from the primary of the transformer by the switching circuit to generate a voltage at the secondary of the transformer. The voltage obtained in this way is filtered and supplied to the measuring circuit. The switching mode transformer is controlled in such a way as to supply a relatively constant voltage to the measuring circuit.

The voltage is typically controlled by means of a return coil that monitors the secondary voltage and sends a control signal to the switching circuit to control the time for which the main capacitor is connected to the transformer. The return winding is typically wound around the core between the primary and the secondary. The return winding is closely coupled to the secondary to monitor precisely the variation in the voltage at the outputs of the secondaries in order to generate the control signal sent to the switching circuit.

Note that the earth of the measuring circuit is often different from that of the power supply circuit. For example, for a multiphase meter adapted to operate in the event of loss of the neutral, the main capacitor will be supplied with power by a current resulting from rectification of all the phases and the neutral relative to an earth which is common to the rectifier and to the power supply circuit and which is different from neutral. On the other hand, the earth of the measuring circuit is the neutral.

In the event of an interruption of the current, the power supply to the measuring circuit is assured for a period of time by the charge stored in the capacitor. To identify an interruption of the current and to determine the remaining quantity of charge, the measuring circuit must monitor how the voltage across the main capacitor varies. Given that the earth of the power supply circuit and that of the measuring circuit are not the same, it is not possible for the measuring circuit to measure the voltage directly.

In conventional systems, the voltage is measured via an isolating interface between the two circuits, for example by using an optocoupler or a differential amplifier adapted to measure the potential difference across the capacitor. These solutions are relatively costly and necessitate the use of a large number of components to define the interface.

OBJECTS AND SUMMARY OF THE INVENTION

One aim of the present invention is to overcome the problems associated with the prior art systems to enable the voltage across the capacitor of the power supply circuit to be monitored with a minimum of additional components.

An electricity meter of the present invention has a monitoring circuit comprising an additional winding wound around the core of the transformer between the core and at least a part of the primary and an integrator circuit connected in parallel with the additional winding and rated to supply a voltage substantially proportional to the voltage across the main capacitor.

The additional winding between the core of the transformer and the primary is very closely coupled to the primary. However, the primary screens it from the effects of currents flowing in the secondary windings and in the return winding. The effect of the coupling between the additional winding and the primary is to enable the additional winding to track closely variation of the voltage across the main capacitor and thereby provide an indication of an interruption in the current and a measurement of the charge remaining in the capacitor.

The additional winding can be wound directly around the core, between the core and the primary. Other embodiments are possible, however, for example one in which the primary is divided into two parts, the additional winding being wound between the two parts of the primary. The additional winding will be screened by the primary from the effects of currents flowing in the secondary windings and/or flowing in a return winding.

Compared with conventional monitoring systems, the solution of the present invention is of relatively low cost and can be implemented with a small number of components.

As described above, in a switching mode transformer, the voltage across the main capacitor is applied for a variable period of time. This period of time is determined by the control signal received, for example, from the return winding. The aim of this control system is to assure a relatively constant voltage at the outputs of the secondary. The return winding is closely coupled to the secondary and generates a control signal that responds rapidly to changes in the secondary voltage. It is therefore impossible to determine the value of the main capacitor voltage using the value of the voltage at the output of the secondary.

In contrast, in the monitoring circuit, the close coupling between the additional winding and the primary and the weak coupling between the return winding and the additional winding together with the ratings of the integrator circuit enable the monitoring circuit to supply a reliable image of the capacitor voltage, despite the switching of the voltage effected by the switching circuit.

The exact values of the components in the integrator circuit will be chosen by the manufacturer depending on other parameters of the system, in particular the voltages and the currents in the circuit, the rating of the transformer, etc. Nevertheless, to assure correct operation of the monitoring circuit the integrator circuit is rated to have a relatively short time constant.

In an integrator circuit comprising a capacitor and a resistor, the value of the resistor is normally relatively high and the value of the capacitor is normally relatively low.

In comparison, the filter circuit between a secondary winding and the measuring circuit is normally defined by a relatively high time constant and includes a high-value capacitor.

The number of turns of the additional winding is preferably relatively small compared to the number of turns of the primary winding. For example, in the case of a 40:1 ratio between the main capacitor voltage and the voltage measured by the monitoring circuit, the ratio between the number of turns of the additional winding and the number of turns of the primary winding can have a value of 1:33. The exact value of the ratio depends on the ratings of the circuit, the coupling between the primary and the core, the coupling between the core and the additional winding, etc.

The integrator circuit is preferably also provided with a diode for rectifying the current at the output of the additional winding.

The present invention applies in particular to a power supply circuit for an electricity meter with a switching mode transformer provided with a return winding that monitors the voltage of the secondary to supply a control signal to the switching circuit.

Other embodiments of a switching mode transformer are known, for example, which use a sensor to measure the secondary voltage directly in order to generate the control signal applied to the switching circuit. A return winding represents the optimal solution given the necessity to isolate the primary from the secondary of the transformer.

In one preferred embodiment of the present invention, the switching mode transformer has two secondaries having a common earth and wound around the transformer in opposite directions to supply a positive voltage and a negative voltage, respectively.

Most measuring circuits used in electricity metering require a power supply able to provide a positive voltage and a negative voltage and this embodiment meets this requirement.

BRIEF DESCRIPTION OF THE DRAWINGS

The invention will be better understood after reading the following description of one embodiment of the invention given by way of illustrative and non-limiting example and referring to the accompanying drawings, in which.

MORE DETAILED DESCRIPTION

Figure 1:
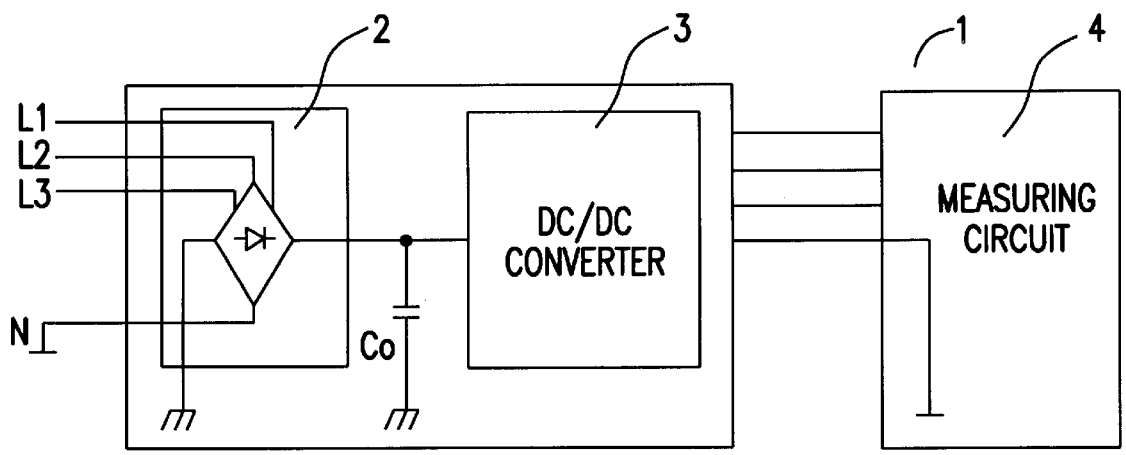
FIG. 1 shows the general architecture of an electricity meter.

FIG. 1 shows the internal organization of a three-phase meter that can withstand loss of the neutral. The meter 1 is formed of a power supply circuit comprising a rectifier part 2 and DC/DC converter part 3 together with a measuring circuit 4. The first part, the rectifier circuit 2, connects the meter 1 to the three phases $L_1$, $L_2$, $L_3$ and to the neutral N of the three-phase mains electricity power supply and its output supplies a direct current voltage to a main capacitor $C_0$. The aim of the invention is to obtain an image of this direct current voltage across $C_0$ at the input of the DC/DC converter 3 in order to detect any reduction of current in the mains electrical power supply.

Figure 2:
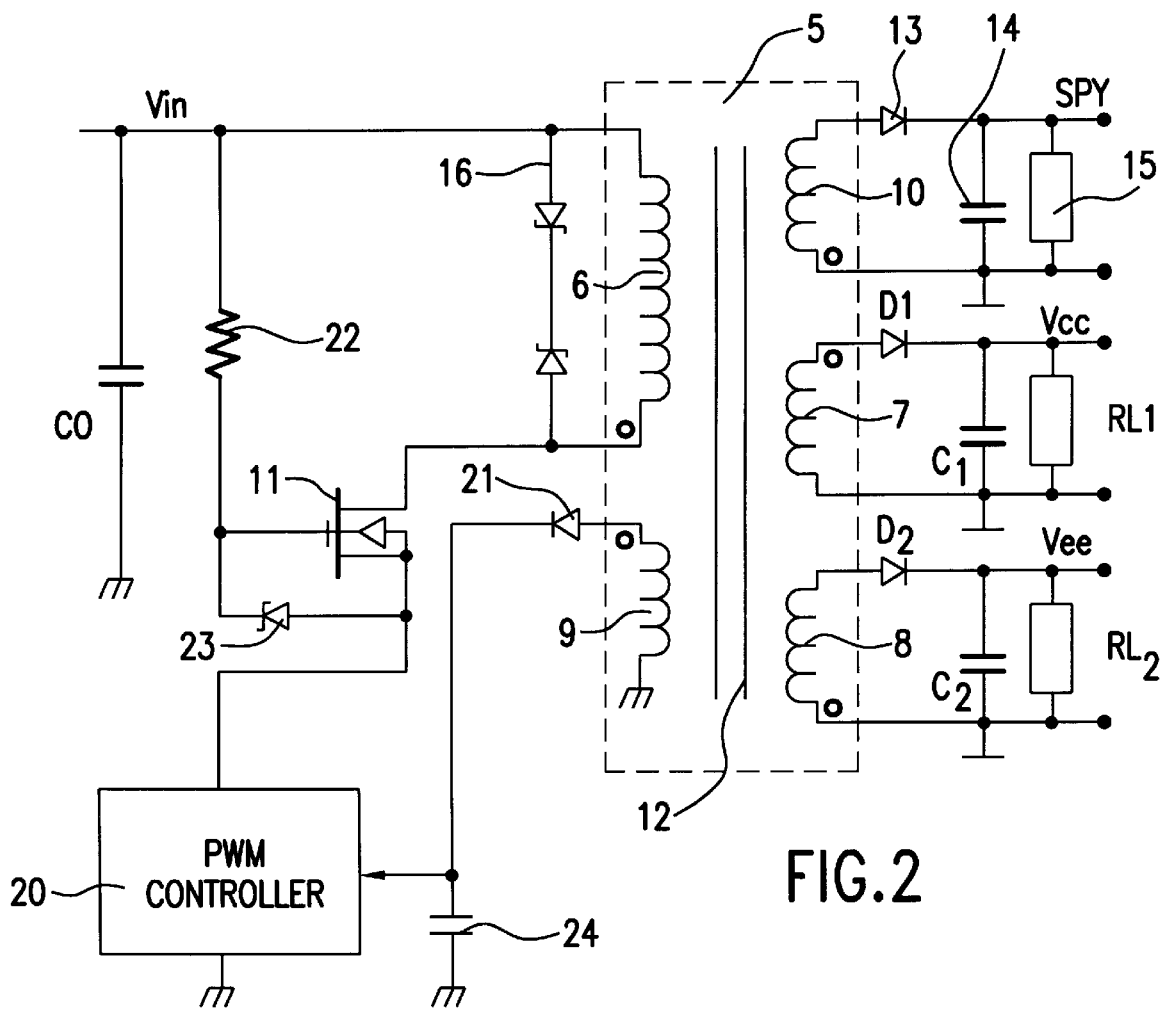
FIG. 2 shows the architecture of a DC/DC converter in accordance with the present invention comprising a transformer connected to a PWM controller.

The rectifier circuit 2 and the converter circuit 3 supply power to the measuring circuit 4. Referring to FIG. 2, the DC/DC converter circuit employed comprises a switching circuit with a PWM controller 20 and a transformer 5. The main capacitor $C_0$, the voltage across which is to be imaged, can be seen at the input.

The power supply circuits and the measuring circuit do not have the same potential reference. The capacitor $C_0$, the PWM controller 20 and the primary circuit 6 of the transformer 5 are referred to the earth of the circuit whereas the whole of the secondary circuit made up of the components 7, 8, 10 which supplies power to the measuring circuit and the measuring circuit itself are referred to the neutral. Obviously, it is difficult to measure the voltage across the main capacitor directly at the secondary because the potential references are not the same.

Figure 3:
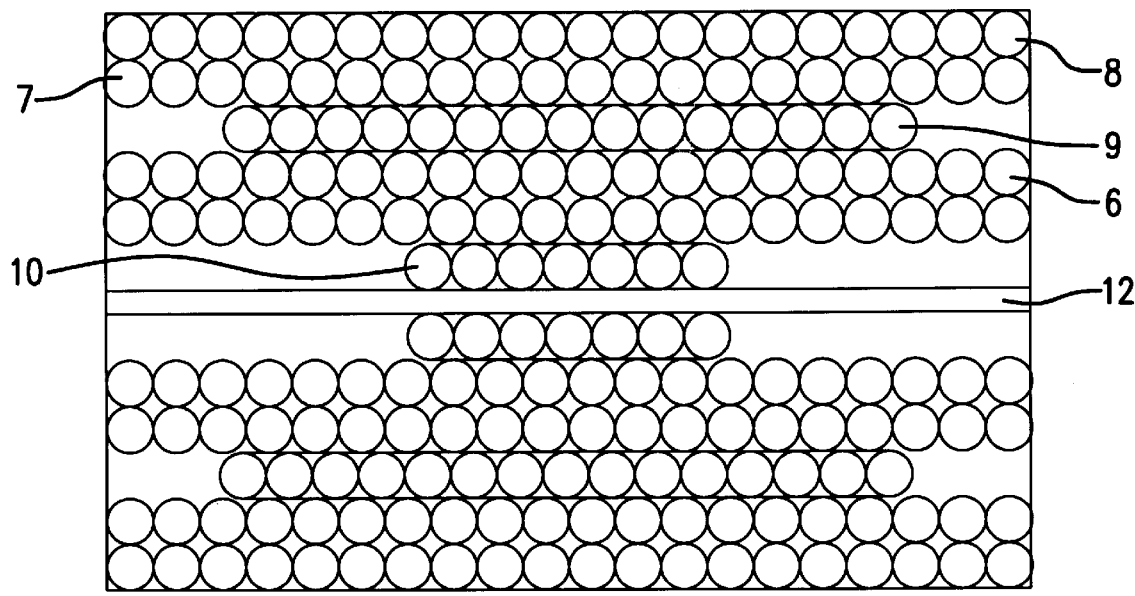
FIG. 3 is a schematic showing the internal arrangement of the various windings around the core of the transformer from FIG. 2.

The transformer 5 employed, shown in FIG. 3, is initially formed of four different successive windings: a primary winding 6 which is wound around the core 12, a return winding 9 around the primary winding 6, a first secondary winding 7 around the return winding 9, and finally a second secondary winding 8 around the first secondary winding 7. In accordance with the invention an additional winding 10 is inserted between the core 12 and the primary winding 6 to obtain a reliable image of the voltage across the capacitor $C_0$, which is also the voltage across the primary 6.

A constant DC voltage is required at the output of the two secondary circuits. A positive voltage Vcc must be obtained at the output of the first secondary circuit and, symmetrically, a negative voltage Vee must be obtained at the output of the second secondary circuit. To this end each secondary circuit includes a diode, a capacitor and a resistor in parallel with the winding.

A diode $D_1$ is connected after the winding 7, a capacitor $C_1$ and a resistor $RL_1$ in parallel with the winding and to the diode to obtain a positive voltage Vcc, for example. Similarly, a diode $D_2$ is connected after the winding 8, a capacitor $C_2$ and a resistor $RL_2$ in parallel with the winding and to the diode to obtain a negative voltage Vee, for example.

The direction in which the windings are wound is indicated in the diagrams in the conventional manner by the dot beside each winding, and the orientation of the diodes are reversed between the two circuits to obtain a positive voltage at the output of the first secondary circuit and a negative voltage at the output of the second secondary circuit, respectively.

The return winding 9 connected to a diode 21 and to a capacitor 24 monitors the voltage at the terminals of the secondary circuits and its function is to modify the primary voltage to obtain the direct current voltages at the output of the secondary circuits. The return winding and the secondaries are closely coupled. Under the influence of the secondary circuits, the return circuit monitors the PWM controller 20 and a transistor 11. The latter two components form a switching circuit which controls the time for which the main capacitor $C_0$ is connected to the primary winding 6. A circuit 16 made up of a zener diode and a conventional diode is connected in parallel with the primary winding to limit the overvoltage due to the electromotive force induced in the inductance of the primary when the switching circuit opens. In exactly the same way a zener diode is connected in parallel with the transistor 11 to protect it from excessively high voltages applied to its terminals. A resistor 22 biases the zener diode 23 to control the transistor and to protect its input from overvoltages.

The location of the windings in the transformer 5 assigns a particular role to each winding. Accordingly, a new winding 10 in accordance with the invention is not necessarily added between the core 12 and the primary 6 because it must be subject to the influence of the primary winding. FIG. 3 shows that the additional winding 10 is remote from the return winding 9 and accordingly plays no role in the control function exercised by the return winding 9 and, conversely, is not subject to the influence of that winding.

Consider, by way of example, a primary winding 6 with 132 turns, a first secondary winding 7 with 23 turns, a second secondary winding 8 with 17 turns, a return winding 9 with 34 turns and an additional winding 10 with four turns. The 132 turns of the primary winding are sufficient to form a screen around the additional winding so that the latter is not subject to the influence of the return winding and the number of turns of the additional winding is small compared with that of the primary winding and is low in cost.

Figure 5:
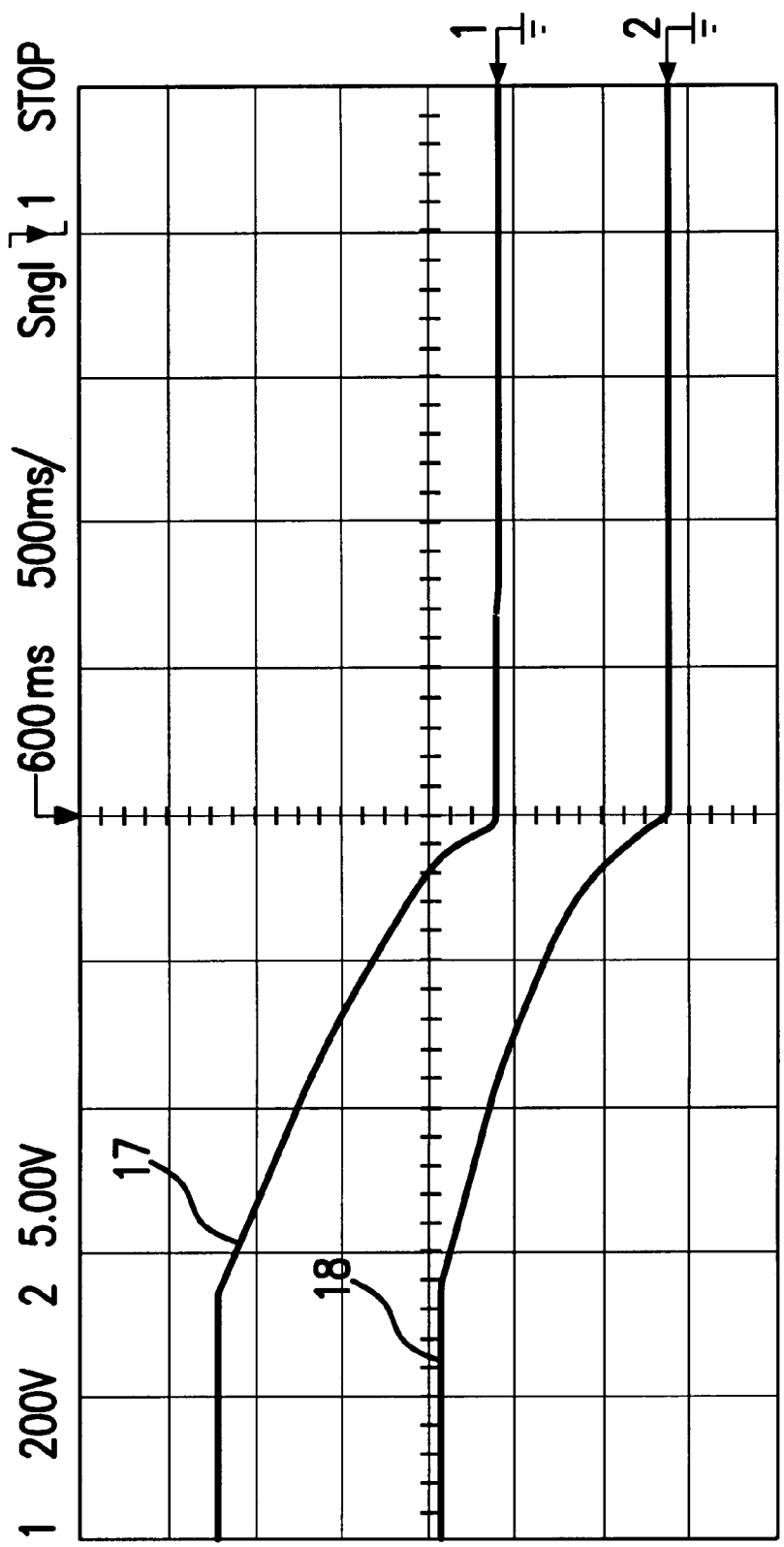
FIG. 5 shows how the output voltage of the additional winding and the voltage across the main capacitor vary with time.

FIG. 5 indicates the voltages across the capacitor and at the output. For a voltage of 200 V at the input of the DC/DC converter circuit the output voltage is 5 V. There is a ratio of 40:1 between the two voltages. The ratio between the number of turns of the additional winding and the number of turns of the primary winding is preferably 1:33.

Finally, the additional winding is very closely coupled only to the primary. The voltage obtained at the output is a reliable image of the voltage at the primary and therefore of that across the capacitor $C_0$ because of a diode 13 connected to the additional winding and an integrator circuit having a very low time constant. The integrator circuit defined by the capacitor 14, the resistor 15 and the diode 13 is rated to filter the voltage and to ignore the switching of the primary winding voltage effected by the switching circuit.

In this embodiment, the components used in the output circuits of each of the windings 7, 8, 10 have the following values:

Capacitor 14=100 nF
Capacitor $C_1$=220 $\mu$F
Capacitor $C_2$=220 $\mu$F
Resistor 15=167.3 k$\Omega$
Resistor $RL_1$=62$\Omega$
Resistor $RL_2$=250$\Omega$ The values $RL_1$ and $RL_2$ are more precisely determined by the resistance of the measuring circuit of the meter.

Figure 4:
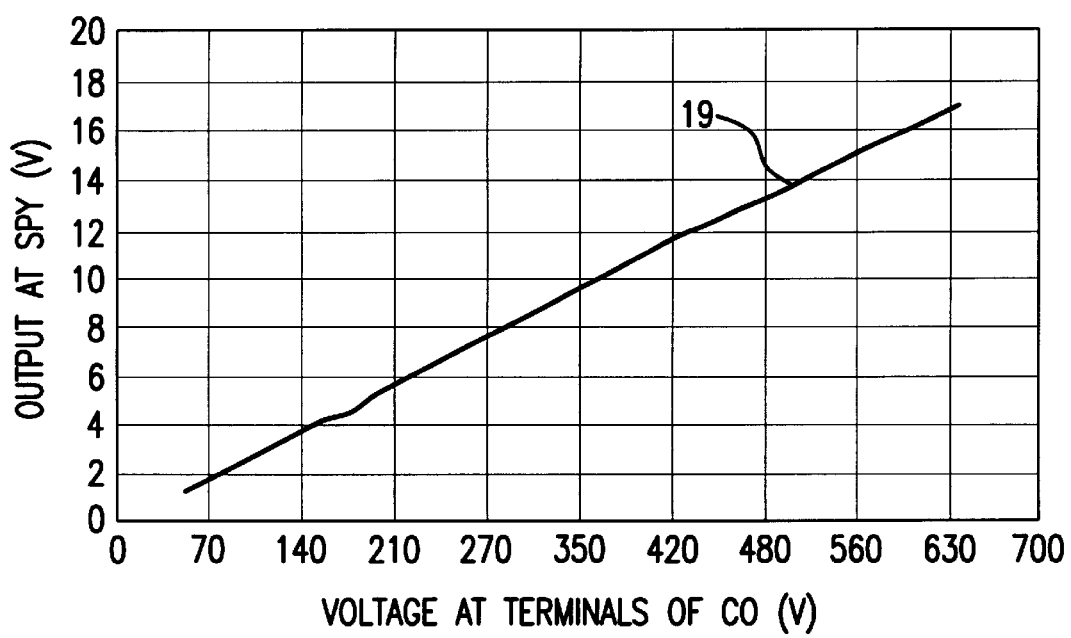
FIG. 4 is the curve of the output of the additional winding as a function of the voltage across the main capacitor.

FIG. 4 shows the linear relationship obtained between the output voltage and the voltage across the capacitor $C_0$. FIG. 5 shows the display on an oscilloscope connected to compare the variation with time of the voltage across the capacitor $C_0$ (curve 17) and that of the output voltage (curve 18). Apart from the offset, the output voltage reproduces the voltage across the capacitor $C_0$. A variation in the voltage across the capacitor immediately causes a variation in the output voltage. A voltage drop on the mains power supply will therefore be reproduced instantaneously and identified at the output.

I claim:

1. An electronic electricity meter comprising a measuring circuit and a power supply circuit comprising a main capacitor supplied with power by a mains electrical power supply and a switching mode transformer having at least one primary wound around the core of the transformer and at least one secondary wound around the primary, the primary being connected to the main capacitor via a switching circuit and the secondary being connected to the measuring circuit, and a monitoring circuit comprising an additional winding wound around the core of the transformer between the core and at least a part of the primary and an integrator circuit comprising at least a capacitor and a resistor connected in parallel with the additional winding and rated to supply a voltage between the points to which the resistor is connected substantially proportional to the voltage across the main capacitor.

2. An electronic electricity meter according to claim 1, wherein the integrator circuit is rated to have a relatively small time constant.

3. An electronic electricity meter according to claim 1, wherein the integrator circuit comprises a capacitor and a resistor, the value of the resistor is relatively high and the value of the capacitor is relatively low.

4. An electronic electricity meter according to claim 1, wherein the number of turns of the additional winding is relatively small compared to the number of turns of the primary winding.

5. An electronic electricity meter according to claim 4, wherein the ratio between the number of turns of the additional winding and the number of turns of the primary winding has a value of 1:33.

6. An electronic electricity meter according to claim 1, wherein the integrator circuit includes a diode for rectifying the additional winding output current.

7. An electronic electricity meter according to claim 1, wherein the switching mode transformer has a return winding which monitors the secondary voltage to supply a control signal to the switching circuit.

8. An electronic electricity meter according to claim 1, wherein the switching mode transformer has two secondary windings having a common earth and wound around the transformer in opposite directions to supply a positive voltage and a negative voltage, respectively.

9. An electronic electricity meter according to claim 1, wherein the main capacitor and the primary of the transformer are referred to a first earth and the measuring circuit and the secondary of the transformer are referred to the neutral.

* * * * *